United States Patent
Amano et al.

(10) Patent No.: US 9,510,472 B2
(45) Date of Patent: Nov. 29, 2016

(54) COVER AND INFORMATION PROCESSING APPARATUS WITH COVER

(71) Applicant: NINTENDO CO., LTD., Kyoto (JP)

(72) Inventors: Masaki Amano, Kyoto (JP); Hideaki Kamata, Kyoto (JP)

(73) Assignee: NINTENDO CO., LTD., Kyoto (JP)

( * ) Notice: Subject to any disclaimer, the term of this patent is extended or adjusted under 35 U.S.C. 154(b) by 134 days.

(21) Appl. No.: 14/511,509

(22) Filed: Oct. 10, 2014

(65) Prior Publication Data

US 2015/0334861 A1 Nov. 19, 2015

(30) Foreign Application Priority Data

May 13, 2014 (JP) ................................. 2014-099272

(51) Int. Cl.
*H05K 5/03* (2006.01)
*H05K 5/02* (2006.01)
*G06F 1/16* (2006.01)
*H04M 1/02* (2006.01)

(52) U.S. Cl.
CPC .............. *H05K 5/03* (2013.01); *G06F 1/1616* (2013.01); *G06F 1/1635* (2013.01); *H04M 1/0283* (2013.01); *H05K 5/0217* (2013.01); *H05K 5/0252* (2013.01); *H04M 1/0252* (2013.01)

(58) Field of Classification Search
CPC ...... G06F 1/1616; G06F 1/16; G06F 1/1641; G06F 1/1643; G06F 1/1652; G06F 1/1677; G06F 1/1681; G06F 1/1626; G06F 1/1635; G06F 1/1662; H05K 5/0008; H05K 5/0017; H05K 5/0217; H05K 5/03; H05K 7/1427; H05K 5/00; H05K 5/0086; H05K 5/0204; H05K 5/0252; H04M 1/0283
USPC ............ 361/679.01, 679.02, 679.55–679.58; 455/575.1–575.4
See application file for complete search history.

(56) References Cited

U.S. PATENT DOCUMENTS

| | | | |
|---|---|---|---|
| 7,016,184 B1 | 3/2006 | Oneyama et al. | |
| 7,499,284 B2 | 3/2009 | Kawanobe et al. | |
| 8,512,152 B2 | 8/2013 | Ehara et al. | |
| 2010/0085693 A1* | 4/2010 | Koshiishi | A63F 13/08 361/679.02 |

FOREIGN PATENT DOCUMENTS

| | | |
|---|---|---|
| DE | 20 2005 003 040 U1 | 6/2005 |
| JP | 07-239729 | 9/1995 |
| JP | 2004-139558 | 5/2004 |
| JP | 2005-348024 | 12/2005 |
| JP | 2006-314706 | 11/2006 |
| JP | 2012-018430 | 1/2012 |
| JP | 2012-199649 | 10/2012 |
| JP | 2013-055510 | 3/2013 |
| WO | 2012/127822 | 9/2012 |

OTHER PUBLICATIONS

European Search Report (3 pgs.) dated May 7, 2015 issued in corresponding European Application No. 14193045.3.
Communication pursuant to Article 94(3) EPC (6 pgs.) dated May 20, 2015 issued in corresponding European Application No. 14193045.3.

* cited by examiner

*Primary Examiner* — Anthony Haughton
*Assistant Examiner* — Ingrid Wright
(74) *Attorney, Agent, or Firm* — Nixon & Vanderhye P.C.

(57) ABSTRACT

An upper cover attaching concavity and a lower cover attaching concavity are respectively formed on rear surfaces of an upper housing and a lower housing of a non-limiting example portable game apparatus, and hook recesses each having a portion existing beneath an area are formed on a flat surface of the upper cover attaching concavity and fitting recesses are formed on side surfaces. Hook recesses each having a portion existing beneath an area are formed on a flat surface of the lower cover attaching concavity and fitting recesses are formed on side surfaces. Hooks are inserted into the hook recesses and fitting projections fit into the fitting recesses, whereby an upper cover is attached to the upper cover attaching concavity. Hooks are inserted into the hook recesses and fitting projections fit into the fitting recesses, whereby a lower cover is attached to the lower cover attaching concavity.

16 Claims, 9 Drawing Sheets

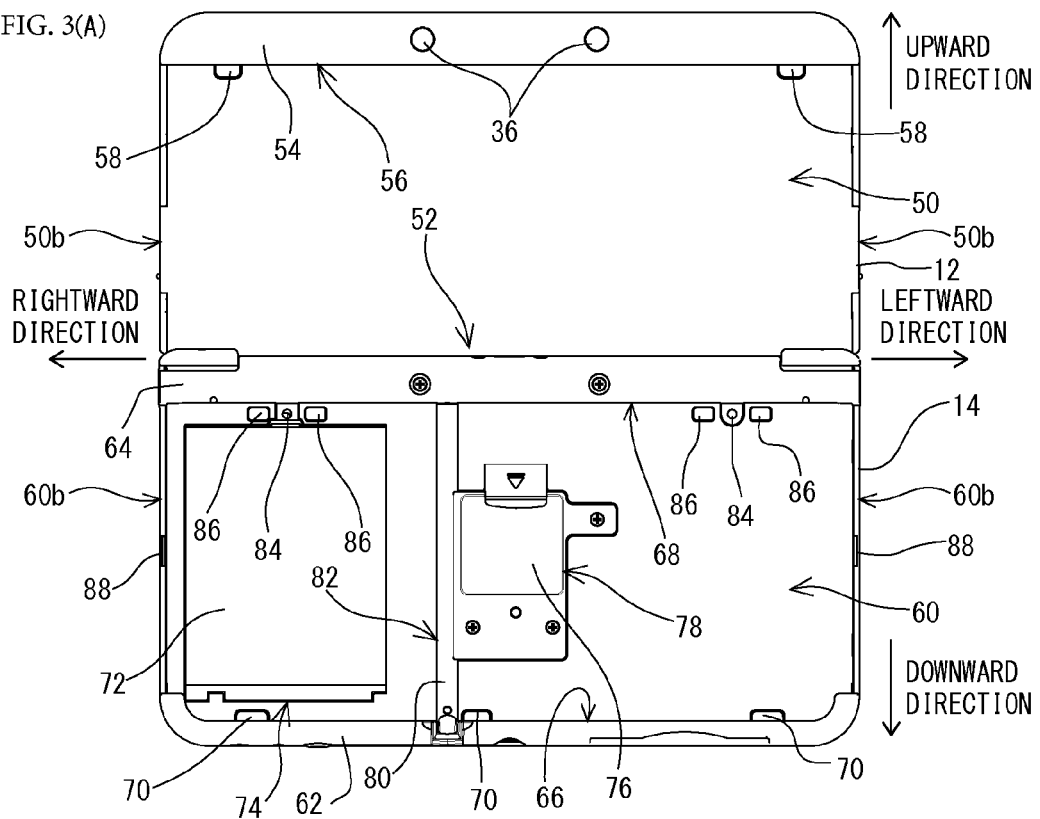
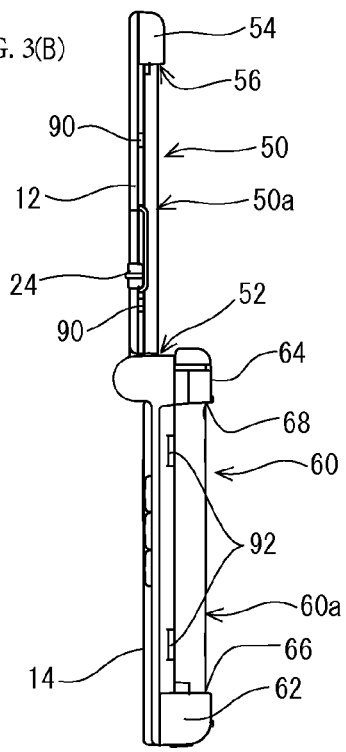
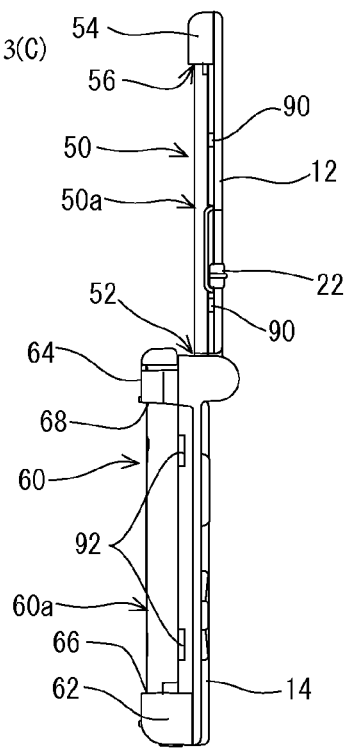

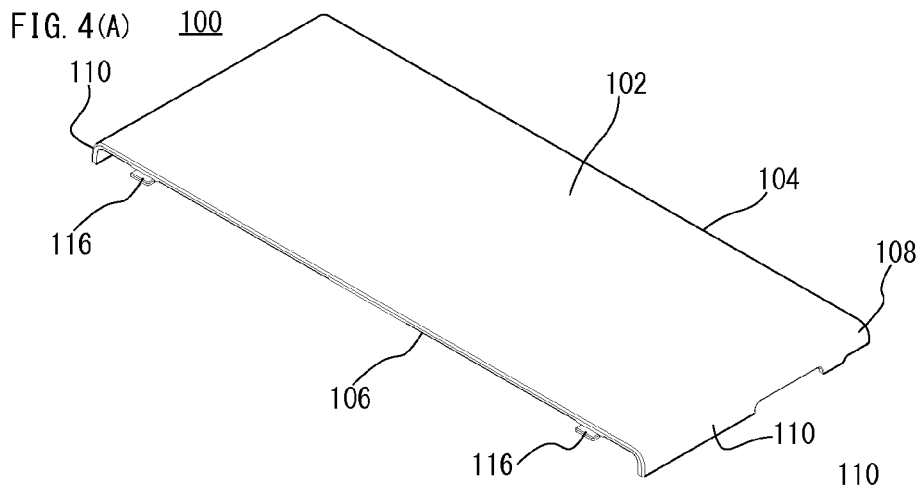
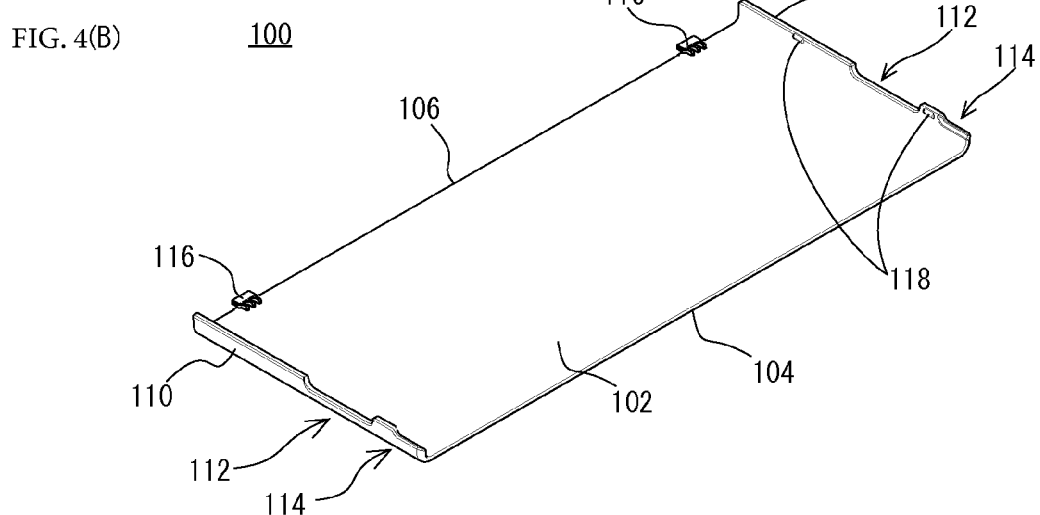
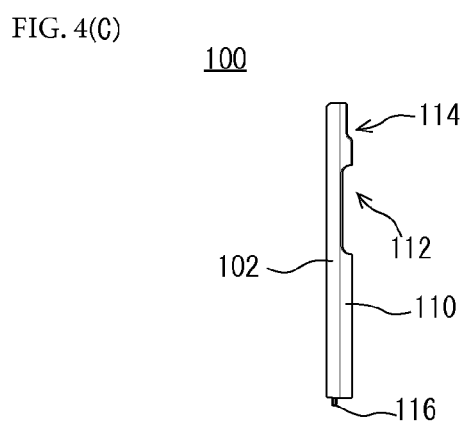
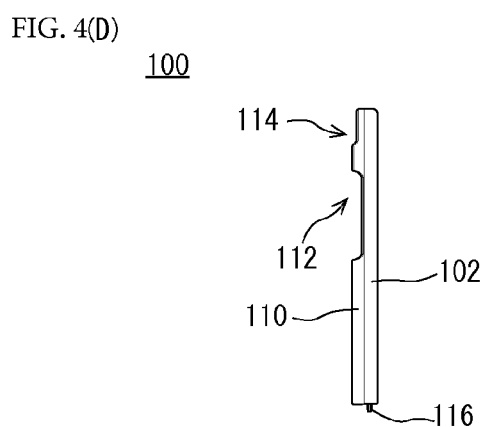

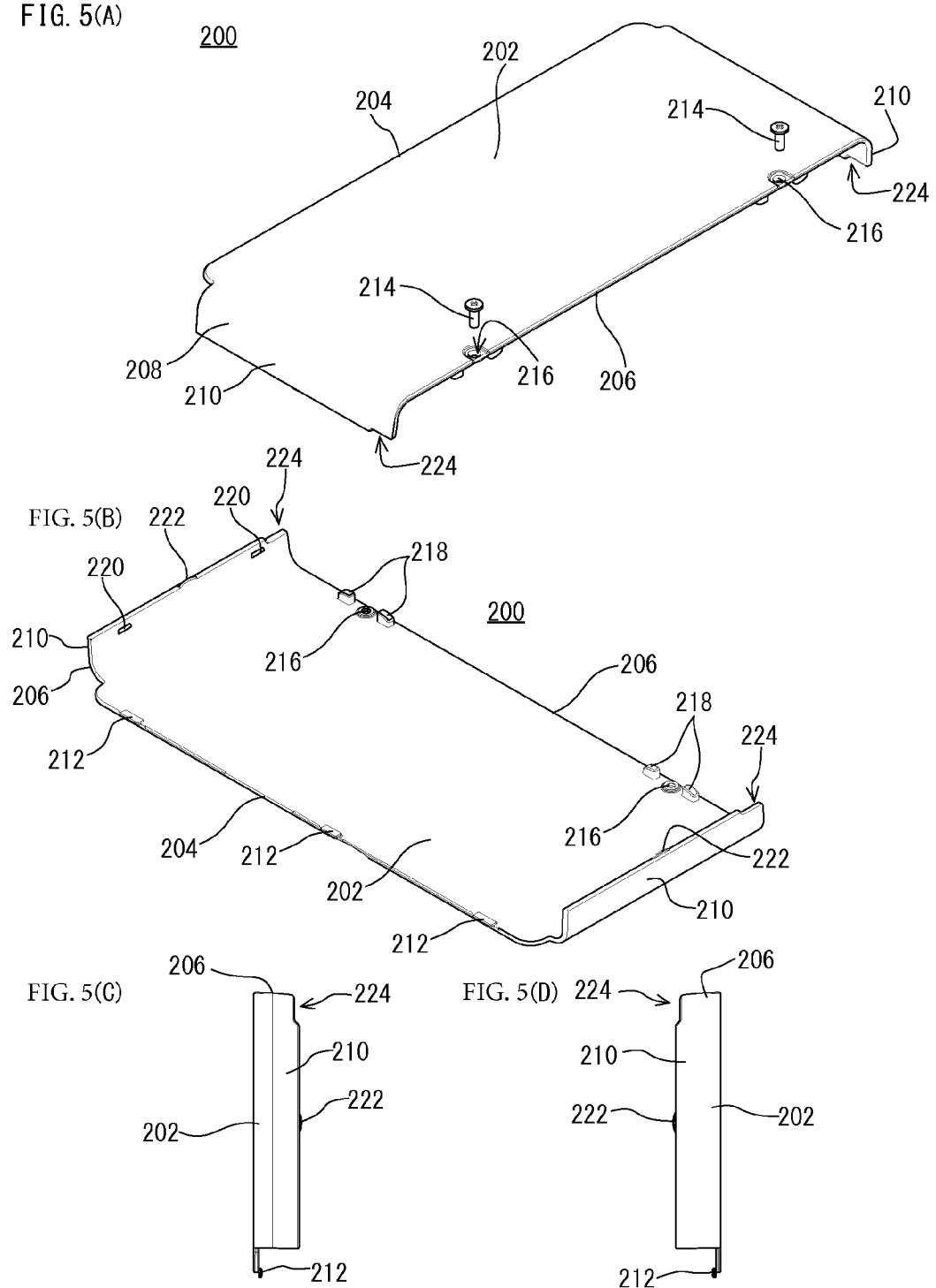

COVER AND INFORMATION PROCESSING APPARATUS WITH COVER

CROSS REFERENCE OF RELATED APPLICATION

The disclosure of Japanese patent application No. 2014-099272 filed on May 13, 2014 is incorporated by reference.

FIELD

This application describes a cover that is detachably attached to an outer surface of a housing of an information processing apparatus and an information processing apparatus with the cover.

SUMMARY

It is a primary object of embodiments to provide a novel cover and information processing apparatus with cover.

Furthermore, it is another object of the embodiments to provide a cover capable of constituting a part of a housing and an information processing apparatus with the cover.

A first embodiment is a cover that is attached to an attaching portion that includes a first surface and a second surface adjacent to the first surface, comprising: a first cover portion; and a second cover portion. The first cover portion of the cover covers the first surface that is a rectangular shape. Furthermore, the second cover portion of the cover is formed at both ends of the first cover portion in a first direction, respectively. The cover is formed with a fitting projection on an inner surface of the second cover portion. The fitting projection fits into a fitting recess that is formed on the second surface of the attaching portion. A hook is formed on one end edge of the first cover portion in a second direction orthogonally intersecting the first direction, and is inserted into a hook recess that is formed on the first surface.

In accordance with the first embodiment, the cover is attached to the attaching portion to be constituted as a part of a housing having such an attaching portion.

A second embodiment is according to the first embodiment, further comprising a first notch for releasing fitting of the first fitting projection and the fitting recess in the second cover portion.

In accordance with the second embodiment, since the first notch is provided, it is possible to easily release the fitting of the first fitting projection and the fitting recess when detaching the cover.

A third embodiment is according to the second embodiment, wherein the first notch is formed at a side of an end edge opposite to the one end edge that the hook is formed in the second direction. When detaching the cover from the attaching portion, the cover is raised by placing a tip end of a stick having a flat tip end or a fingertip on the notch, for example.

In accordance with the third embodiment, since the cover is detached with using the notch, the cover can be easily detached.

A fourth embodiment is according to the first embodiment, further comprising a second fitting projection. The second fitting projection is formed on an end of the second cover portion opposite to an end that is coupled to the first cover portion, and fits into a depression that is formed on the second surface.

In accordance with the fourth embodiment, the second cover portion of the cover is prevented from being expanded outward in a state that the cover is attached to the attaching portion.

A fifth embodiment is according to the first embodiment, wherein a fitting direction of the first fitting projection is the first direction or approximately the first direction. Furthermore, an inserting direction of the hook is the second direction or approximately the second direction. Accordingly, the inserting direction of the hook to the fitting direction of the first fitting projection is perpendicular or approximately perpendicular.

In accordance with the fifth embodiment, since the inserting direction of the hook to the fitting direction of the first fitting projection is perpendicular or approximately perpendicular, it is possible to prevent the cover from being detached by a force from one direction.

A sixth embodiment is according to the fourth embodiment, wherein a fitting direction of the first fitting projection is the first direction or approximately the first direction. Furthermore, a fitting direction of the second fitting projection is a direction perpendicular or approximately perpendicular to the first direction and the second direction. Accordingly, the fitting direction of the second fitting projection to the fitting direction of the first fitting projection is perpendicular or approximately perpendicular.

In accordance with the sixth embodiment, it is also possible to prevent the cover from being detached by a force from one direction.

A seventh embodiment is according to the fourth embodiment, wherein a fitting direction of the second fitting projection is a direction perpendicular or approximately perpendicular to the first direction and the second direction. Furthermore, an inserting direction of the hook is the second direction or approximately the second direction. Accordingly, the inserting direction of the hook to the fitting direction of the second fitting projection is perpendicular or approximately perpendicular.

In accordance with the seventh embodiment, it is also possible to prevent the cover from being detached by a force from one direction.

An eighth embodiment is according to the first embodiment, wherein the first cover portion has a screw hole. The cover further comprises a protecting projection. The protecting projection is provided near the screw hole on an inner surface of the first cover portion.

In accordance with the eighth embodiment, even if a user presses a portion of the screw hole by a hand or steps a portion of the screw hole by a foot, it is possible to prevent, by the protecting projection, the hand or the foot from hitting only a screw.

A ninth embodiment is according to the first embodiment, wherein the attaching portion is provided on the first surface with at least a battery accommodating portion that accommodates a battery. Accordingly, the first cover portion of the cover covers the battery that is accommodated in the battery accommodating portion.

In accordance with the ninth embodiment, it is possible to make the cover not only constitute a part of the housing but also function as a battery cover that covers the battery accommodating portion.

A tenth embodiment is according to the first embodiment, wherein the second cover portion further comprises a second notch to avoid a slide switch that is arranged on the second surface.

In accordance with the tenth embodiment, it is possible to constitute the slide switch operable.

An eleventh embodiment is an information processing apparatus with cover, comprising an information processing apparatus that has a housing, the housing having a cover attaching portion that includes a first surface and a second surface adjacent to the first surface, the second surface being formed with a fitting recess; and a cover that has a first cover portion that covers the first surface, a second cover portion that is formed at both ends of the first cover portion in a first direction, respectively to cover the second surface and a fitting projection that is formed on an inner surface of the second cover portion and fits into the fitting recess.

In accordance with the eleventh embodiment, since the cover attaching portion according to the first embodiment is provided on the housing of the information processing apparatus and the cover according to the first embodiment is attached thereto, the cover is constituted as a part of the housing of the information processing apparatus.

A twelfth embodiment is according to the eleventh embodiment, wherein a hook recess is formed on the cover attaching portion. The cover further has a hook that is formed one end edge of the first cover portion in a second direction orthogonally intersecting the first direction and is inserted into the hook recess.

In accordance with the twelfth embodiment, since an inserting direction of the hook to a fitting direction of the fitting projection is perpendicular or approximately perpendicular, it is possible to prevent the cover from being detached by a force from one direction.

A thirteenth embodiment is according to the twelfth embodiment, wherein the information processing apparatus comprises an upper housing and a lower housing that are coupled with each other in a foldable manner. The cover includes an upper cover that is attached to a first cover attaching portion of the upper housing and a lower cover that is attached to a second cover attaching portion of the lower housing.

In accordance with the thirteenth embodiment, since there are provided with the upper cover and the lower cover that are respectively attached to the upper housing and the lower housing, by exchanging at least one of the covers with another cover, it is possible to enjoy a change of an aesthetic appearance of the information processing apparatus according to a change of color, pattern, image or picture (character's image or picture), etc. that are applied to the cover. That is, it is possible to enjoy a change in design of the information processing apparatus.

A fourteenth embodiment is according to the thirteenth embodiment, wherein one of the first cover attaching portion and the second cover attaching portion is formed with at least a battery accommodating portion that accommodates a battery, and one of the upper cover and the lower cover covers the battery that is accommodated in the battery accommodating portion.

In accordance with the fourteenth embodiment, it is possible to also make the upper cover or the lower cover function as a battery cover that covers the battery accommodating portion.

A fifteenth embodiment is a cover group comprising a first cover and a second cover for covering a first housing and a second housing that are coupled to each other in a foldable manner of an information processing apparatus, the first housing having a first surface and a second surface adjacent to the first surface, the second housing having a third surface and a fourth surface adjacent to the third surface, wherein the first cover has a first cover portion that covers the first surface and a second cover portion that covers the second surface, the second cover portion being provided with a first fitting projection that is formed on an inner surface of the second cover portion and fits into a fitting recess that is formed on the second surface, and the second cover has a third cover portion that covers the third surface and a fourth cover portion that covers the fourth surface, the third cover portion being formed with a screw hole, the fourth cover portion being provided with a second fitting projection that is formed on an inner surface of the fourth cover portion and fits into a fitting recess that is formed on the fourth surface.

In accordance with the fifteenth embodiment, it is also possible to constitute the covers as a part of the housings.

The above described objects and other objects, features, aspects and advantages of the embodiments will become more apparent from the following detailed description when taken in conjunction with the accompanying drawings.

BRIEF DESCRIPTION OF THE DRAWINGS

FIGS. 3(A)-(C) are a schematic view showing a non-limiting example of the portable game apparatus in a state that the upper cover and the lower cover are detached, FIG. 3 (A) is a rear view, FIG. 3 (B) is a right side view, and FIG. 3 (C) is a left side view.

FIGS. 4(A)-(D) shows a non-limiting example of the upper cover that is attached to the upper housing of the portable game apparatus, FIG. 4 (A) is a perspective view viewing the upper cover from a rear side (outer surface), FIG. 4 (B) is a perspective view viewing the upper cover from a back side (inner surface), FIG. 4 (C) is a left side view, and FIG. 4 (D) is a right side view.

FIGS. 5(A)-(D) shows a non-limiting example of the lower cover that is attached to the lower housing of the portable game apparatus, FIG. 5 (A) is a perspective view viewing the lower cover from a rear side (outer surface), FIG. 5 (B) is a perspective view viewing the cover from a back side (inner surface), FIG. 5 (C) is a left side view, and FIG. 5 (D) is a right side view.

FIG. 6(B) is a schematic partly sectional view enlargedly showing the fitting projection and the fitting recess in that state, FIG. 6 (C) shows a state that a flat portion of the upper cover is closely contacted to a flat surface of the upper cover attaching concavity of the upper housing, and FIG. 6 (D) is a schematic partly sectional view enlargedly showing the fitting projection and the fitting recess in that state.

FIG. 7(B) shows a state that a flat portion of the lower cover is closely contacted to a flat surface of the lower cover attaching concavity of the lower housing.

DETAILED DESCRIPTION OF NON-LIMITING EXAMPLE EMBODIMENTS

Figure 1:
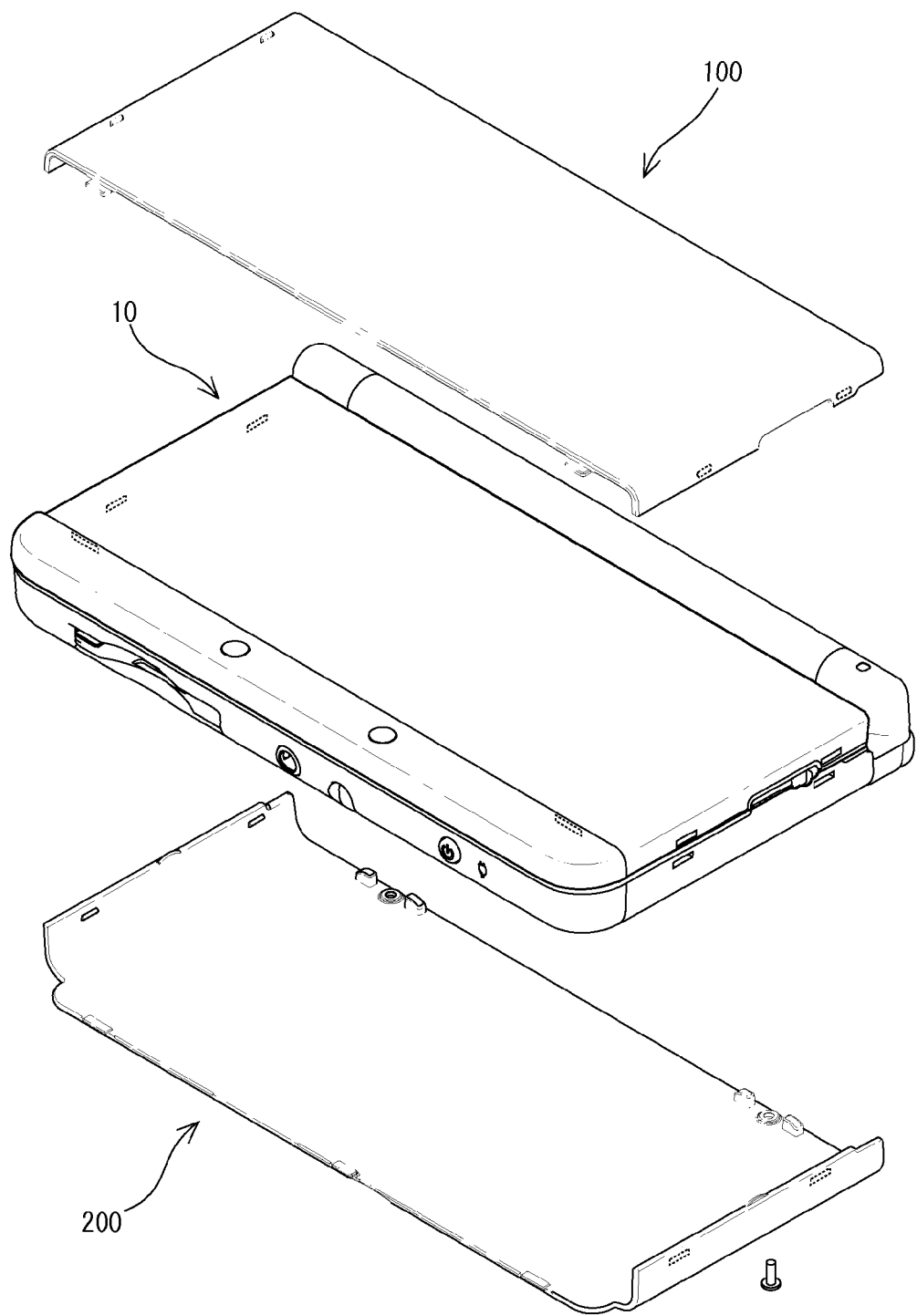
FIG. 1 is a schematic view showing a non-limiting example upper cover and lower cover and a portable game apparatus that is attached with the upper cover and the lower cover.

With referring to FIG. 1, a non-limiting example upper cover 100 and lower cover 200 are attached to respective outer surfaces (rear) of an upper housing 12 and a lower housing 14 of a portable terminal (a portable game apparatus in this embodiment) 10 that is an example of an information processing apparatus. That is, the upper cover 100 is constituted as a part of the upper housing 12, and the lower cover 200 is constituted as a part of the lower housing 14.

The upper housing 12 and the lower housing 14 are coupled to each other to be turnable mutually with using a hinge. FIG. 1 shows a state that the upper housing 12 and the lower housing 14 of the portable game apparatus 10 are folded.

Figure 2A:
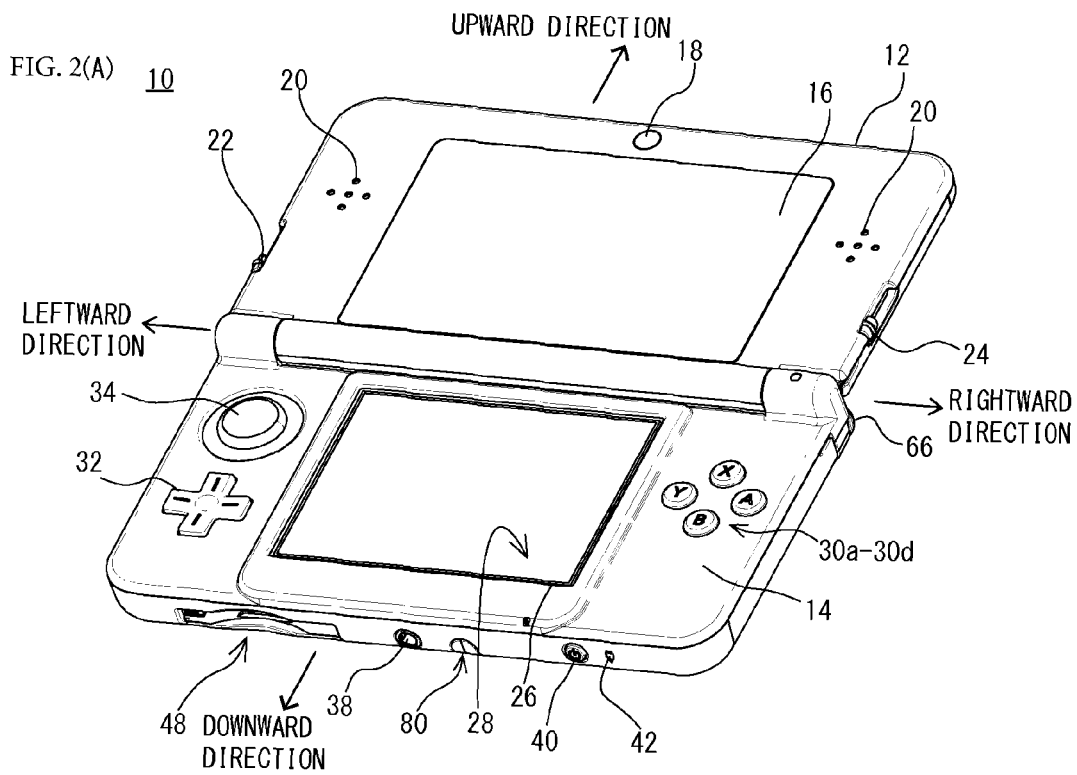
FIGS. 2 (A)-(B) shows a non-limiting example of the portable game apparatus in a state that an upper housing and a lower housing that are attached with the upper cover and the lower cover are opened, FIG. 2 (A) is a perspective view of the portable game apparatus viewing a front side obliquely, and FIG. 2 (B) is a perspective view of the portable game apparatus viewing a rear side obliquely.
Figure 2B:
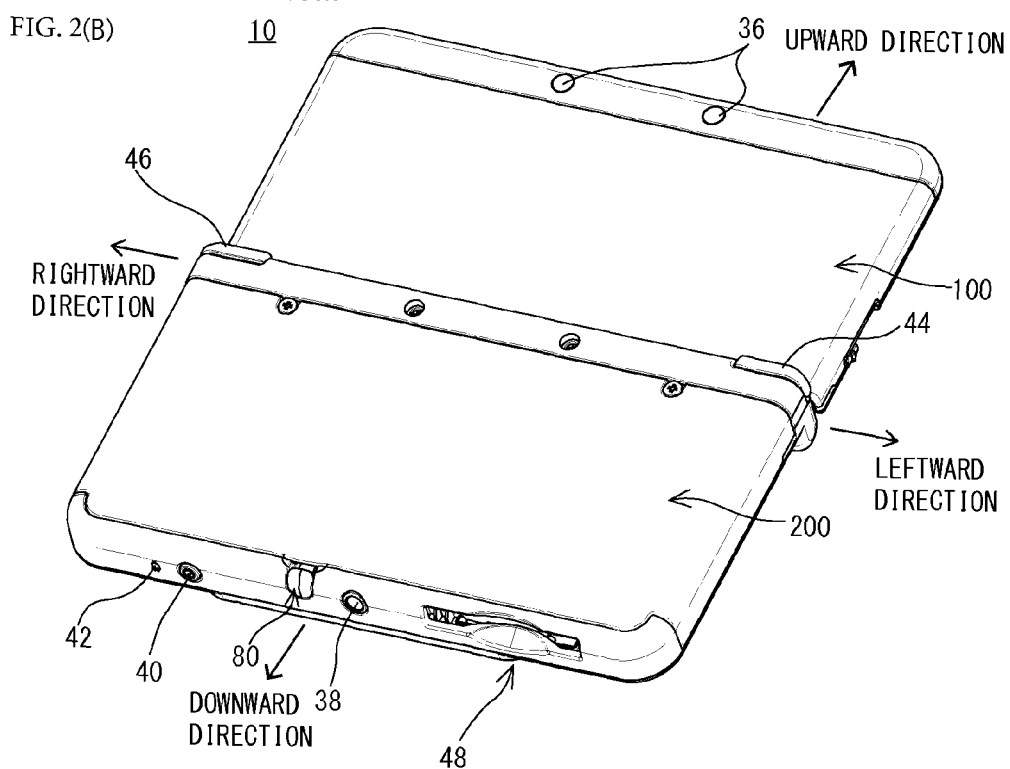
Figure 6A:
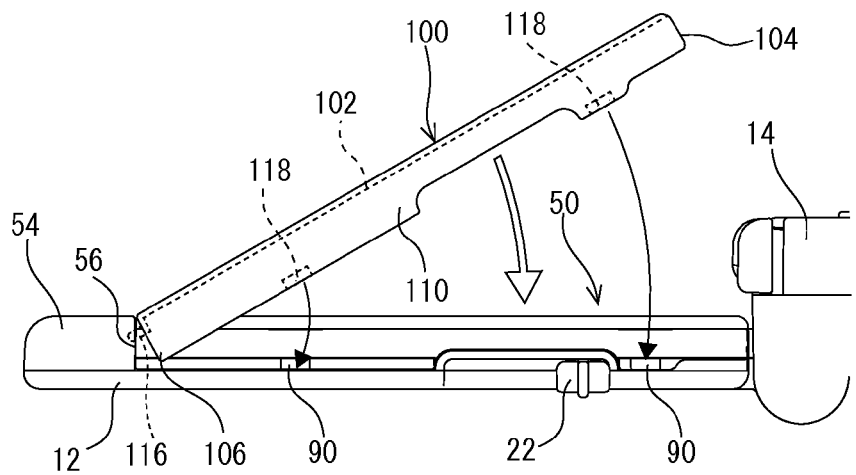
FIGS. 6(A)-(D) is a schematic view showing a non-limiting example process that the upper cover is attached to a rear side of the upper housing, FIG. 6 (A) shows a state that a fitting projection of the upper cover is inserted into a fitting recess of an upper cover attaching concavity of the upper housing.
Figure 6B:
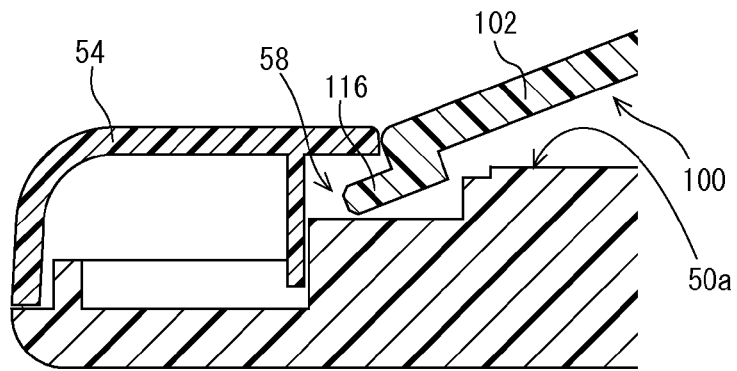
Figure 6C:
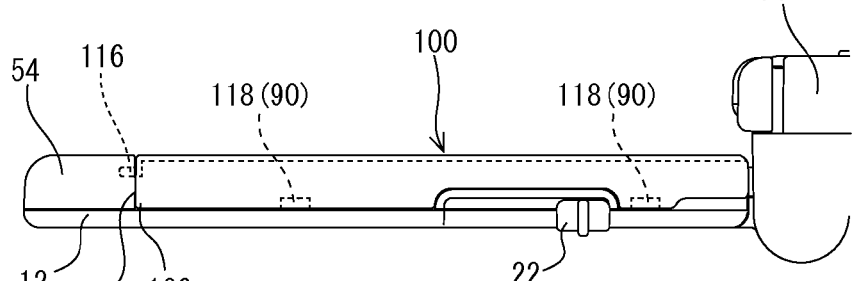
Figure 6D:
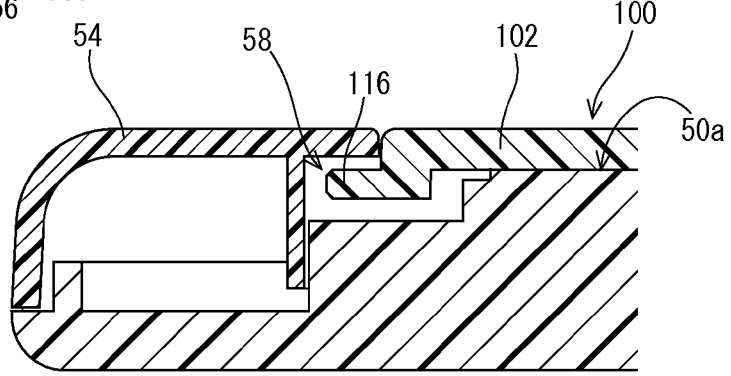

FIG. 2 shows a state that the upper housing 12 and the lower housing 14 of the portable game apparatus 10 shown in FIG. 1 are opened. As shown in FIG. 2, in the portable game apparatus 10, the upper housing 12 and the lower housing 14 are formed in oblong rectangle shapes and attached on respective rear sides with the upper cover 100 and the lower cover 200. That is, FIG. 2 shows a portable game apparatus with cover 10 as an example of a portable terminal with cover.

It should be noted that in a state that the portable game apparatus 10 is opened as shown in FIG. 2 (A) and FIG. 2 (B), a side that the upper cover 100 and the lower cover 200 are attached is called the rear side, and a side opposite to the rear is called the front side. That is, FIG. 2 (A) is a perspective view that the portable game apparatus 10 in an opened state is viewed from the front side, and FIG. 2 (B) is a perspective view that the portable game apparatus 10 in the opened state is viewed from the rear side.

Furthermore, in the following in this specification, with using up, down, left and right directions in a case that the portable game apparatus 10 is viewed from the front, up, down, left and right directions of the portable game apparatus 10 as shown in FIG. 2 (A), the upper housing 12, the lower housing 14, the upper cover 100 and the lower cover 200 will be described. In addition, an up-and-down direction may be called a vertical direction, and a left-and-right direction may be called a horizontal direction. Furthermore, a direction that goes to the front side from the rear side or a direction that goes from the rear side to the front side of the portable game apparatus 10 shown in FIG. 2 (A) is called a thickness direction.

Therefore, as to the up, down, left and right directions of the portable game apparatus 10 in FIG. 2 (B), the up and down directions are the same as those of the portable game apparatus 10 shown in FIG. 2(A) and the left and right directions are reversed.

In addition, as shown in FIG. 1, in the portable game apparatus 10 of a folded state, the up direction of the first housing 12 and the down direction of the second housing 14 agree with each other, and the down direction of the first housing 12 and the up direction of the second housing 14 agree with each other. However, in FIG. 1, the left and right directions of the first housing 12 and the left and right directions of the second housing 14 are in agreement.

An upper LCD16 applicable to a naked eye 3D display is provided on the front side of the upper housing 12, and an inner camera 18 is provided above the upper LCD16, and sound emission holes 20, 20 that emit a sound or voice from speakers (not shown) are formed on the left and right of the upper LCD 16. A slide switch (volume control switch) 22 that controls the volume of the speaker or headphone is provided on a left side surface of the upper housing 12, and on a right side surface, a slide switch (3D control switch) 24 that controls a degree of stereoscopic in the upper LCD16 (degree of 3D) is provided.

A lower LCD 26 with a touch panel 28 is arranged on the front side of the lower housing 14, and operation buttons 30a-30d such as A, B, X, and Y are provided at a right side of the lower LCD 26, and a cross key 32 and an analog pad 34 are provided at a left side of the lower LCD 26.

Furthermore, two outer cameras 36 that are shown in FIG. 2 (B) and applicable to a 3D photographing are provided on the rear side of the upper housing 12 of the portable game apparatus 10. Furthermore, a headphone jack 38, a power switch 40, a power indicator 42, etc. are provided in a lower end surface of the lower housing 14 of the portable game apparatus 10. Furthermore, an L button 44 is provided at a left side of an upper end surface of the lower housing 14 of the portable game apparatus 10, and an R button 46 is provided at a right side of the upper end surface.

Furthermore, a card slot 48 for receiving a game card (not shown) that is a storage medium storing in advance a game program for enjoying a game with the portable game apparatus 10 is provided on the lower end surface of the lower housing 14 of the portable game apparatus 10. However, it does not need to be limited to a game, and a program about an application other than a game may be stored in the game card. Furthermore, a program such as a game program may be acquired via a network such as Internet.

Between the headphone jack 38 and the power switch 40 on the lower end surface of the lower housing 14, a touch pen or stylus 80 (FIG. 3) for touching the above-mentioned touch panel 28 to input a touch signal into the portable game apparatus 10 is accommodated. That is, the stylus 80 is inserted and held beneath the lower cover 200 in the thickness direction of the lower housing 14 from the lower end surface of the lower housing 14.

In addition, although the upper LCD 16 is a 3D LCD according to a parallax barrier system, and displays an image that can be seen as a stereoscopic view with naked eyes (auto-stereoscopic image), the upper LCD 16 may be a 2D LCD similar to the lower LCD 26. Furthermore, a system of stereoscopic view is not limited to the parallax barrier system, and a lenticular system utilizing a sheet with concave/convex (lenticular lens), and other glassless 3D systems may be adopted.

A rear view and side views of the portable game apparatus 10 that the upper cover 100 and the lower cover 200 are detached are shown in FIG. 3. FIG. 3 (A) is the rear view, FIG. 3 (B) is a right side view, and FIG. 3 (C) is a left side view.

An upper cover attaching concavity 50 that is for attaching thereon to the upper cover 100 and has a depth equivalent to a thickness of the upper cover 100 is formed on the rear side of the upper housing 12 of the portable game apparatus 10 of this embodiment. The upper cover attaching concavity 50 includes a rectangular flat surface (bottom surface) 50a and side surfaces 50b that are formed at both ends of the flat surface 50a in the horizontal direction. A horizontal direction of the flat surface 50a of the upper cover attaching concavity 50 is formed by a horizontal full length of the upper housing 12. Furthermore, a vertical direction of the upper cover attaching concavity 50 is formed from an end edge (lower end portion) 52 at a side being coupled with the lower housing 16 to an end surface (lower end portion) 56 of an area 54 for the outer cameras 36 on the upper housing 12. That is, the flat surface 50a of the upper cover attaching concavity 50 is formed approximately an entire surface of the rear side of the upper housing 12 while leaving the area 54 for arranging the outer cameras 36.

Hook recesses 58 that receive hooks 116 (see FIG. 4) of the upper cover 100 and hold the hooks 116 are formed in two places of the horizontal (width) direction of the upper housing 12 at a position of the end surface 56 of the area 54 of the upper cover attaching concavity 50. Each of these hook recesses 58 is formed as a groove that makes a hole on the flat surface 50a of the upper cover attaching concavity 50 and continues up to a place beneath the area 54. That is, a part of each hook recess 58 is on the flat surface 50a of the upper cover attaching concavity 50, and a remaining part is beneath the area 54 of the first housing 12 in the thickness direction (inside the first housing 12). Accordingly, the area 54 functions as a presser of the hooks 116.

Similarly, a lower cover attaching concavity 60 that is for attaching with the lower cover 200 and has a depth equivalent to the thickness of the lower cover 200 is also formed on the rear of the lower housing 14. The lower cover attaching concavity 60 includes a rectangular flat surface (bottom surface) 60a and side surfaces 60b that are formed at both ends of the flat surface 60a in the horizontal direction. A horizontal direction of the flat surface 60a of the lower cover attaching concavity 60 is formed by horizontal full length of the lower housing 12. A vertical direction of the lower cover attaching concavity 60 is formed from an end surface (upper end portion) 66 of an area 62 to an end surface (lower end portion) 68 of an area 64 such that the area 62 and the area 64 are left in a lower end portion and an upper end portion of the rear side of the lower housing 14, respectively.

Hook recesses 70 that receive hooks 212 (see FIG. 5) of the lower cover 200 and hold the hooks 212 are formed in three places of the horizontal (width) direction of the lower housing 14 at a position of the end surface 66 of the lower cover attaching concavity 60. Each of these hook recesses 70 is formed as a groove that makes a hole on the flat surface 60a of the lower cover attaching concavity 60 and continues up to a place beneath the area 62. That is, a part of each hook recess 70 is on the flat surface 60a of the lower cover attaching concavity 60, and a remaining part is beneath the area 62 of the second housing 14 in the thickness direction (inside the second housing 14). Accordingly, the area 62 functions as a presser of the hooks 212.

In addition, the area 62 of the lower housing 14 is formed from the lower end surface of the lower housing 14 succeeding to a part of each of a left side surface and a right side surface, as well seen from FIG. 3.

As well also seen from FIG. 3 (A), the lower cover attaching concavity 60 of the lower housing 14 is provided with a battery accommodating portion 74 for accommodating and holding a secondary battery 72, a storage medium accommodating portion 78 for accommodating and holding a storage medium 76 such as an SD card and a longitudinal stylus accommodating portion 82 that is for accommodating and holding a stylus 80 and extended in the vertical direction of the lower housing 14.

Since the lower cover 200 (see FIG. 5) that is attached to such a lower cover attaching concavity 60 achieves a function to press down and hold the secondary battery 72 and the storage medium 76, it can be called a battery lid combination cover.

The lower cover attaching concavity 60 is further formed with screw holes 84 for receiving screws 214 (see FIG. 5 and FIG. 7) at a position above the battery accommodating portion 74 and a position on the right of the storage medium accommodating portion 78, respectively beneath the end surface 68. Furthermore, protecting projection recesses 86 are formed in both sides sandwiching each of the screw holes 84. The protecting projection recesses 86 are for receiving the protecting projections 218 (FIG. 5) of the lower cover 200 described later.

At approximately a center in the vertical direction of each of left and right ends of the lower cover attaching concavity 60 of the lower housing 14, a depression 88 that is depressed in a depth direction of the page space of FIG. 3 (A) (above-described thickness direction) is formed. A projection 222 (see FIG. 5) described later of the lower cover 200 is inserted into the depression 88.

As well seen from FIG. 3 (B) and FIG. 3 (C), fitting recesses 90 that fitting projections 118 (see FIG. 4) of the upper cover 100 fit thereinto are formed at two places, respectively in both sides surfaces 50b of the upper cover attaching concavity 50 of the upper housing 12, and fitting recesses 92 that fitting projections 220 (see FIG. 5) of the lower cover 100 fit thereinto are formed at two places, respectively in both sides surfaces 60b of the lower cover attaching concavity 60 of the lower housing 12.

The upper cover 100 shown in FIG. 4 in detail is made from a plastic or metal, for example, and includes a flat portion 102 that has a shape and size capable of covering an entire surface of the flat surface 50a of the above-described lower cover attaching concavity 50. A length in the vertical direction of the flat portion 102 is defined by a lower end edge 104 corresponding to the end edge 52 of the upper cover attaching concavity 50 shown in FIG. 3 (A) and an upper end edge 106 corresponding to the end surface 56. The upper cover 100 further has side portions 110 that follow both ends of the flat portion 102 in the horizontal direction via round surfaces 108 and approximately orthogonally intersect with the flat portion 102. There are formed on the side portions 110 with wide notches 112 for securing movable ranges of operation knobs of the volume control switch 22 and the 3D control switch 24 shown in FIG. 2 and FIG. 3 and narrow notches 114 that are separated from the notches 112 with intervals and extend up to lower end edges 104. However, if the notch 114 is provided in a lower end portion, it does not need to be extended up to the lower end edge 104.

Two hooks 116 are formed on the upper cover 100 to project from the upper end edge 106. Furthermore, the hook 116 is arranged at a position corresponding to the hook recess 58 that is formed on the flat surface 50a of the upper cover attaching concavity 50 of the upper housing 12 mentioned above. As well seen from FIG. 6 (A) and FIG. 6 (B), the hook 116 is formed to project from a position that falls down further inward from an inner surface of the flat portion 102 (surface visible in FIG. 4 (B)). Accordingly, an upper surface (outer surface) of the hook 116 becomes a position that falls down from an outer surface of the flat portion 102 (surface visible in FIG. 4 (A)).

It should be noted that the inner surfaces of the flat portion 102 and the side portions 110 mean surfaces at sides brought into contact with the upper cover attaching concavity 50 when the upper cover attaching concavity 50 of the upper housing 12 is attached with the upper cover 100. Furthermore, the outer surfaces of the flat portion 102, the side portions 110 and the hooks 116 mean surfaces become the rear (rear side) of the portable game apparatus 10 when the upper cover attaching concavity 50 of the upper housing 12 is attached with the upper cover 100. These are true about the flat portion 202, the side portions 210 and the hooks 212 of the lower cover 200.

Fitting projections 118 are formed at two places in the vertical direction on inner surfaces of the side portions 110 of both sides of the upper cover 100. The fitting projection 118 fits into the fitting recess 90 formed on the side portion of the upper housing 12 shown in FIG. 3 (B) and FIG. 3 (C).

The lower cover 200 shown in FIG. 5 in detail is also made from a plastic or metal, for example, and includes a flat portion 202 that has a shape and size capable of covering an entire surface of the flat surface 60a of the lower cover attaching concavity 60 of the lower housing 14. A length in the vertical direction of the flat portion 202 is defined by a lower end edge 204 corresponding to the end surface 66 of the lower cover attaching concavity 60 shown in FIG. 3 (A) and an upper end edge 206 corresponding to the end surface 68 of the area 64. The lower cover 200 further has side portions 210 that follow both ends of the flat portion 202 in the horizontal direction via round surfaces 208 and approximately orthogonally intersect with the flat portion 102. In addition, as well seen from FIG. 5 (A) to FIG. 5 (C), the side portion 210 of the lower cover 200 begins from a position that falls down by one step from the lower end edge 204 and continues up to the upper end edge 206. A reason why the lower end portion of the side portion 210 is thus upper than the lower end edge 204 is for avoiding the area 62 because the area 62 goes around to the side from the front as shown in the FIG. 3(A)-FIG. 3 (C). Accordingly, the flat portion 202 of the lower cover 200 includes a portion that covers up to the side surfaces of the lower housing 14 of the portable game apparatus 10 and a portion that does not reach the side surface.

Three hooks 212 are formed on the lower cover 200 to project from the lower end edge 204. Furthermore, the hook 212 is arranged at a position corresponding to the hook recess 70 that is formed on the flat surface 60a of the lower cover attaching concavity 60 of the lower housing 14 mentioned above. As well seen from FIG. 5 (A) and FIG. 5 (B), the hook 212 is formed to project from a position that falls down further inward from an inner surface of the flat portion 202 (surface visible in FIG. 5 (B)). Accordingly, an upper surface (outer surface) of the hook 212 becomes a position that falls down from an outer surface of the flat portion 202 (surface visible in FIG. 5 (A)).

Near the upper end edge 206 of the inner surface of the lower cover 200, holes 216 each receiving a screw (metric coarse screw thread, for example) 214 are formed at positions corresponding to the above-described screw holes 84 formed on the lower cover attaching concavity 60 of the lower housing 14. Protecting projections 218 are formed so as to sandwich the hole 216.

When the lower cover 200 is put on the floor, for example while the inner surface of the lower cover 200 is turned upward as shown in FIG. 5 (B) in a state that the screw 214 is inserted into the hole 216, there occurs a state that an axis of the screw 214 is projected from the hole 216 to be out at a side of the inner surface. The protecting projections 218 are formed so as to sandwich the hole 212 in order to make a hand or foot difficult to hit at a tip (tip end) of the screw 214 even if a portion of the hole 212 is pressed by the hand or a portion of the hole 212 is stepped by the foot in the state.

Describing in detail, a height of the protecting projection 218 from the inner surface of the flat portion 202 of the lower cover 200 is set to become slightly higher than a length of a leg of the screw 214 that projects to the side of the inner surface through the hole 216. Furthermore, a tip end (upper end) of the protecting projection 218 is gently curved (not an acute angle). Accordingly, when the lower cover 200 is put on the floor in the above-described state, even if the portion of the hole 216 is pressed by a hand or the portion of the hole 216 is stepped by a foot, a palm or a sole hits at the tip end of the protecting projection 218 ahead of the tip end of the screw 214. That is, the protecting projection 218 prevents a user from pressing down by a hand or stepping on by a foot only the screw 214.

In addition, although in this embodiment, the height of the protecting projection 218 from the inner surface of the flat portion 202 of the lower cover 200 is set to become slightly higher than the length of the leg of the screw 214 projecting to the side of the inner surface through the hole 216, the height may be set to become equal to or slightly lower than the length of the leg. Even if a user's hand or foot touches at the tip end of the screw 214 in such structure, since a user's hand or foot also touches at the protecting projection 218, it is possible to prevent the user from pressing down by a hand or stepping by a foot only the screw 214.

Fitting projections 220 are formed at two places in the vertical direction on an inner surface of each of the side portions 210 of both sides of the lower cover 200. The fitting projection 220 fits into the fitting recess 92 that is formed on the side portion of the lower housing 14 of the portable game apparatus 10 shown in FIG. 3 (B) and FIG. 3 (C).

At approximately a center in the vertical direction on end portions opposite to end portions coupled to the flat portion 202 of the side portions 210 of the lower cover 200 (end portions at the front side of the portable game apparatus 10), projections 222 are formed to project in a direction from the rear side to the front side of the portable game apparatus 10. The projection 222 fits into the depression 88 that is formed on the side end of the lower cover attaching concavity 60 shown in FIG. 2 (A). Furthermore, notches 224 are formed in an upper end portions on the side portions 210 of the lower cover 200 to extend up to the upper end edge 206. However, if the notch 224 is provided on the upper end portion, it does not need to be extended up to the upper end edge 206.

When attaching with the upper cover 100 shown in FIG. 4 onto the upper cover attaching concavity 50 of the rear side of the upper housing 12 shown in FIG. 3, as shown in FIG. 6 (A) and FIG. 6 (B), the hooks 116 are first inserted, in a state of slanting the upper cover 100, into the hook recesses 58 that continue from the flat surface 50a of the upper cover attaching concavity 50 to portions beneath the area 54.

The upper cover 100 is taken down to be closely contacted with the flat surface 50a of the upper cover attaching concavity 50 in a state that the two hooks 116 are inserted into the two hook recesses 58, respectively. That is, as indicated by a void arrow mark in FIG. 6 (A), the upper cover 100 is pushed toward the upper cover attaching concavity 50. At this time, the upper end edge 106 (hook 116) of the upper cover 100 tries to rise upward in FIG. 6 as the upper cover 100 is brought close horizontally, but since the hook 116 exists beneath the area 54 (FIG. 6 (B)), the hook 116 that tries to go up remains beneath the area 54. That is, the upper cover 100 is turned with using the hook 116 as a fulcrum while the hook 116 remains in the hook recess 58.

Then, if the upper cover 100 is further turned until the inner surface of the flat portion 102 of the upper cover 100 contacts the flat surface 50a of the upper cover attaching concavity 50 as shown in FIG. 6 (C) and FIG. 6 (D), the fitting projections 118 (FIG. 5) that are formed on the inner surface of the side portions 110 of the upper cover 100 fit into the fitting recesses 90 that are formed on the side surfaces of the upper housing 12.

Thus, the upper cover 100 can be attached to the rear side of the upper housing 12 as shown in FIG. 2. At this time, since the hook 116 enters beneath the area 54 in the hook recess 58, the upper cover 100 is prevented from rising. Furthermore, since the depth of the flat surface 50a of the upper cover attaching concavity 50 is set to be equivalent to the thickness of the flat portion 102 of the upper cover 100, when the upper cover attaching concavity 50 is attached with the upper cover 100, the surface (outer surface) of the upper cover 100 and the surface of the area 54 become flush.

Furthermore, a direction that the hook 116 is inserted is an upward direction and a direction that the fitting projection 118 fits into the fitting recess 90 is a left-and-right direction, and those directions are perpendicular or approximately perpendicular. Accordingly, it is possible to prevent the upper cover 100 from being detached by a force from one direction.

Figure 7A:
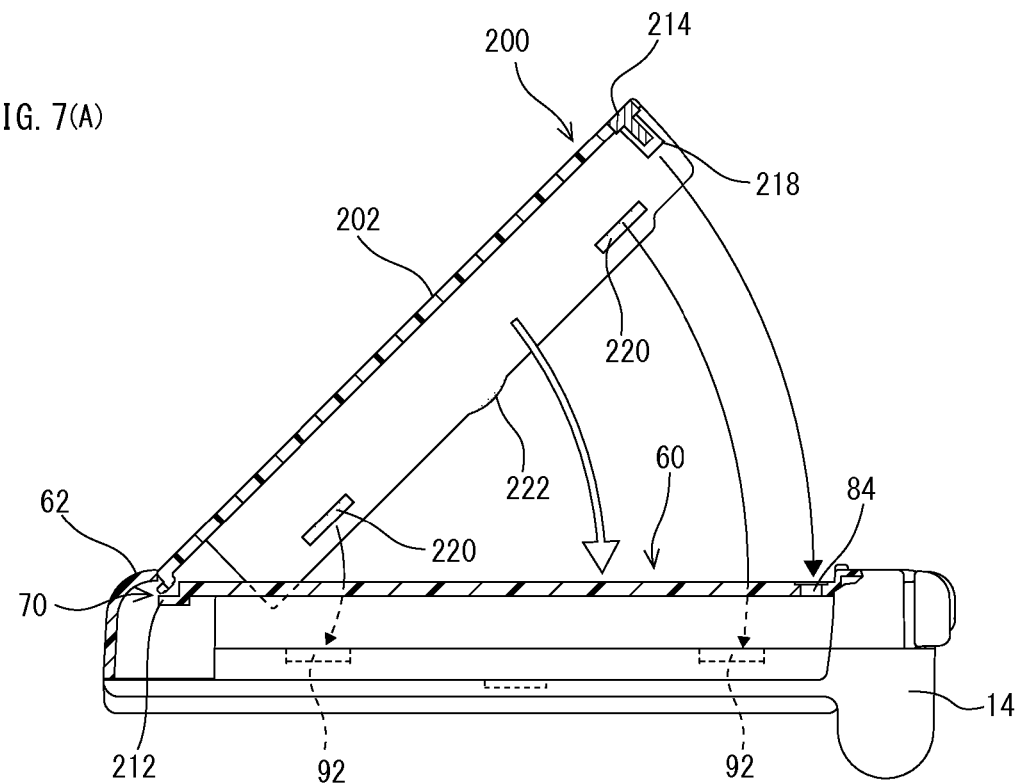
FIGS. 7(A)-(B) is a schematic view showing a non-limiting example process that the lower cover is attached to a rear side of the lower housing, FIG. 7 (A) shows a state that a fitting projection of the lower cover is inserted into a fitting recess of an lower cover attaching concavity of the lower housing.
Figure 7B:
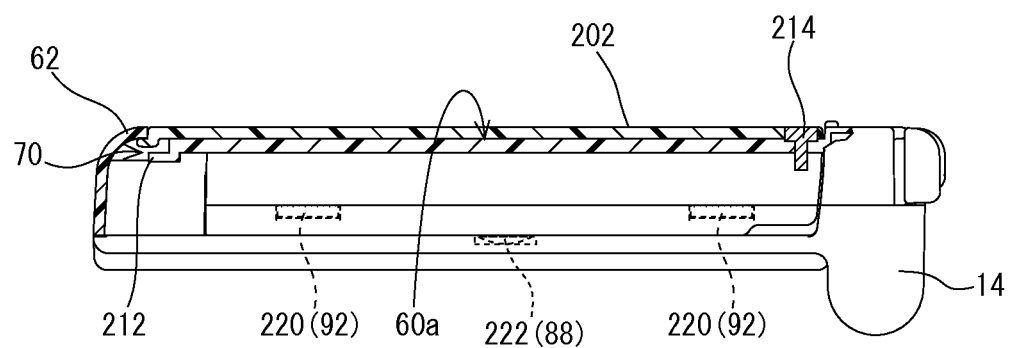

When attaching the lower cover attaching concavity 60 of the rear side of the lower housing 12 shown in FIG. 3 with the lower cover 100 shown in FIG. 5, as shown in FIG. 7 (A), the hooks 212 are first inserted, in a state of slanting the lower cover 200, into the hook recesses 70 that continue from the flat surface 60a of the lower cover attaching concavity 60 to portions beneath the area 62. The lower cover 200 is taken down to be closely contacted with the flat surface 60a of the lower cover attaching concavity 60 in a state that the two hooks 212 are inserted into the two hook recesses 70, respectively. That is, as indicated by a void arrow mark in FIG. 7 (A), the lower cover 200 is pushed toward the lower cover attaching concavity 60. At this time, the lower end edge (hook 212) of the lower cover 200 tries to rise upward in FIG. 7 as the lower cover 200 is brought close horizontally, but since the hook 212 exists beneath the area 62, the hook 212 that tries to go up remains beneath the area 62. That is, the lower cover 200 is turned with using the hook 212 as a fulcrum while the hook 212 remains in the hook recess 70.

Then, as shown in FIG. 7 (B), if the lower cover 200 is further turned until the inner surface of the flat portion 202 of the lower cover 200 contacts the flat surface 60a of the lower cover attaching concavity 60, the fitting projections 222 (FIG. 6) that are formed on the inner surface of the side portions 210 of the lower cover 200 fit into the fitting recesses 92 that are formed on the side surfaces of the lower housing 12.

Furthermore, as shown in FIG. 7 (A) and FIG. 7 (B), the projections 222 (FIG. 5) formed to project from the ends of the side portions 210 of the lower cover 200 at the front side of the portable game apparatus 10 fit into the depressions 88 (FIG. 2) at the side ends of the lower cover attaching concavity 60. The side portion 210 of the lower cover 200 is restrained by the fitting of the projection 222 and the depression 88, whereby a motion that the side portion 210 tries to expand outward (a left-and-right direction of the portable game apparatus 10) can be stopped. That is, the projection 222 and the depression 88 are effective in preventing the side portion 210 of the lower cover 200 from opening outward. This is because it is thinkable that a user plays a game while having the lower housing 14 out of the portable game apparatus 10 in a normal case, and accordingly, if the side portions open outward, it is difficult for the user to have the portable game apparatus 10 and thus the play becomes to be obstructed. Therefore, although the projections 222 are provided on the lower housing 14, no similar projection is provided on the upper housing 12.

In addition, a direction that the hook 212 is inserted is a downward direction, and a direction that fitting projection 220 fits into the fitting recess 92 is a left-and-right direction, and those directions are perpendicular or approximately perpendicular. Furthermore, a direction that the hook 212 is inserted is downward and a direction that projection 222 fits into the depression 88 is a thickness direction, and those directions are perpendicular or approximately perpendicular. Accordingly, a direction that the hook 212 is inserted into the fitting recess 92 is perpendicular or approximately perpendicular to a direction that projection 222 fits into the depression 88. Therefore, it is possible to prevent the lower cover 200 from being detached by a force from one direction.

In addition, in FIG. 7 (A) and FIG. 7 (B), in order to show the fitting projection 220 and the projection 222 intelligibly, these are splashed.

After the lower cover 200 is taken down to be closely contacted with the flat surface 60a of the lower cover attaching concavity 60, the screw 214 is inserted into the screw hole 84 (FIG. 2) through the hole 216 (FIG. 5). Then, the lower cover 200 is fixed onto the lower cover attaching concavity 60 of the lower housing 14. On the other hand, since the hook 212 enters beneath the area 62 in the hook recess 70 and thus no rise of the lower cover 200 occurs, there is no possibility that the secondary battery 72 and the storage medium 76 that are accommodated on the flat surface 60a of the lower cover attaching concavity 60 are fallen. Furthermore, the stylus 80 that is accommodated on the flat surface 60a of the lower cover attaching concavity 60 also does not drop out of the rear side of the portable game apparatus 10.

Furthermore, when the lower cover 200 is fixed onto the lower cover attaching concavity 60 of the lower housing 14, the protecting projections 218 that are formed on the inner surface of the flat portion 202 sandwiching the screw hole 216 of the lower cover 200 fit into the protecting projection recesses 86 that are formed sandwiching the screw hole 84 of the lower cover attaching concavity 60 of the lower housing 14. There is also an advantage that it is possible to prevent a positional displacement of the lower cover 200 on the lower cover attaching concavity 60 by the fitting of the protecting projections 218 and the protecting projection recesses 86.

Thus, as shown in FIG. 2, the lower cover 200 can be attached to the rear side of the lower housing 14. At this time, since the depth of the flat surface 60a of the lower cover attaching concavity 60 is set to be equivalent to the thickness of the flat portion 202 of the lower cover 200, when the lower cover attaching concavity 60 is attached with the lower cover 200, the surface (outer surface) of the lower cover 200 and the surface of the areas 62 and 64 become flush.

Figure 8:
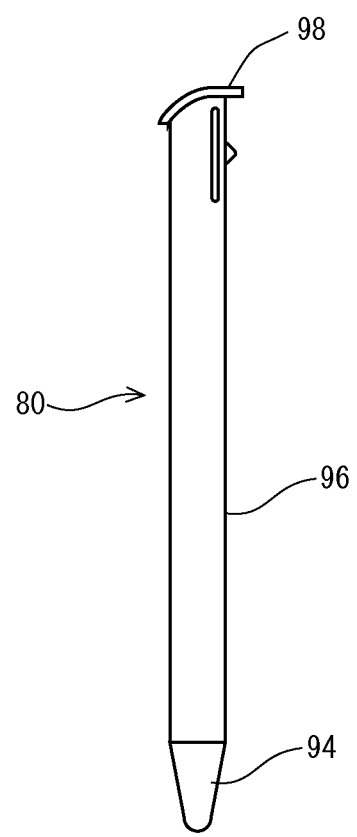
FIG. 8 is a schematic view showing a non-limiting example stylus affiliated with the portable game apparatus of the embodiment.

The stylus 80 for operating the touch panel 28 is shown in FIG. 8, and the stylus 80 includes a leg 96 having a nib 94 and a tabular head 98 at an end opposite to the nib 94 of the leg 96. An outer surface of the tabular head 98 consists of a curved surface and a flat surface to be conformed to a curved surface and a flat surface of a lower end surface of the lower housing 14 that the stylus 80 is accommodated as shown in FIG. 2.

Figure 9:
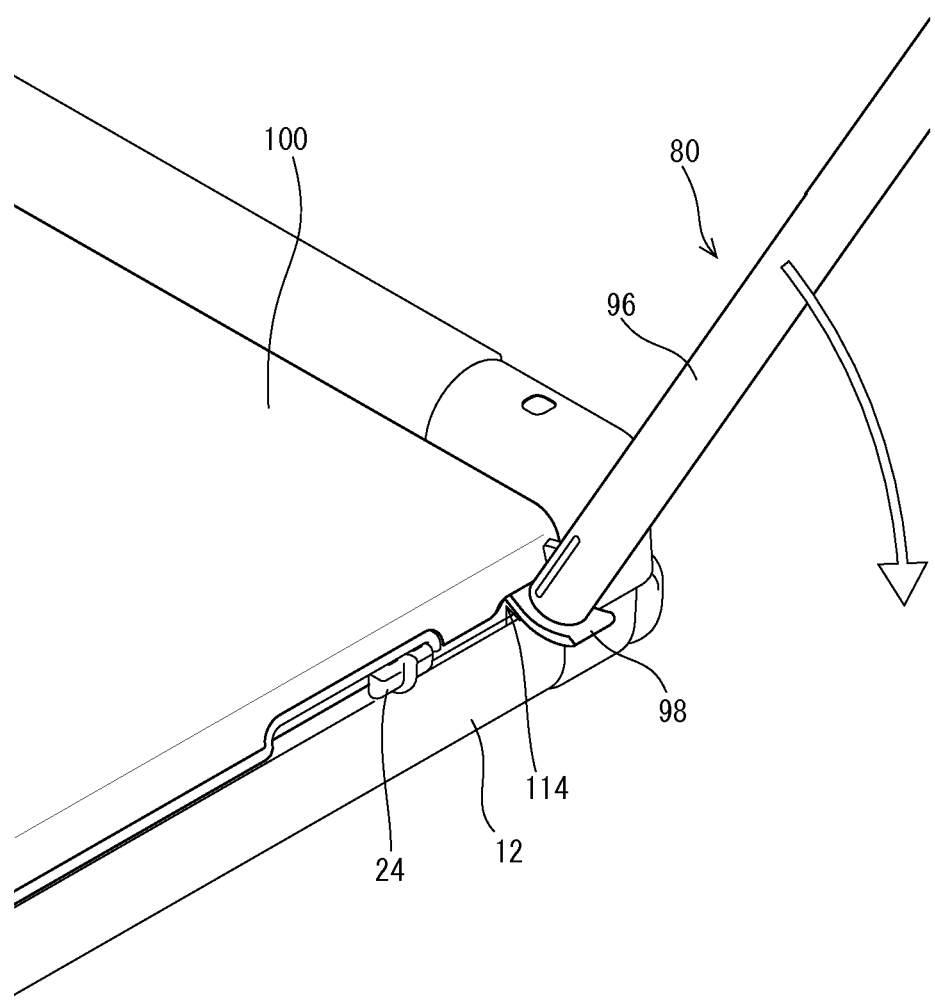
FIG. 9 is a schematic view showing a non-limiting example method of detaching the upper cover using the stylus of FIG. 8.

The stylus 80 as shown in FIG. 8 can be used when the upper cover 100 from the upper housing 12 is to be detached. As shown in FIG. 9, if the leg 96 is pushed down in a direction indicated by a void arrow mark in FIG. 9 in a state that the tabular head 98 of the stylus 80 is inserted into the notch 114 (FIG. 4) of the upper cover 100, by the principle of leverage, the upper cover 100 is raised such that the fitting of the fitting projection 118 (FIG. 4) and the fitting recess 90 (FIG. 3) is released, and then, the upper cover 100 can be detached from the upper housing 12. Since the notch 114 is provided at a side of the lower end edge 104 opposite to a side of the upper end edge 106 that is provided with the hook 116 of the upper cover 100, as described above, by raising from the side of the notch 114 (lower end edge 104 of the upper cover 100), the upper cover 100 is turned with using the hook 116 as a fulcrum. That is, by providing the notch 114, the fitting of the fitting projection 118 and the fitting recess 90 can be released easily. Accordingly, it is possible to simply detach the upper cover 100. However, even if the stylus 80 is not used, it is also possible to detach the upper cover 100 by hanging a finger on the notch 114.

Although not shown, when the lower cover 200 is to be detached, the screw 214 is removed first. After that, like a case that the upper cover 100 is detached, the tabular head 98 of the stylus 80 is inserted into the notch 224 (FIG. 5) of the lower cover 200, and by raising the lower cover 200 according to the principle of leverage, the fitting of the fitting projection 220 (FIG. 5) of the lower cover 200 and the fitting concavity 92 (FIG. 3) can be released.

Since the upper cover 100 and the lower cover 200 are thus attachable and detachable, an esthetic appearance of the portable game apparatus 10 can be changed by exchanging the covers with covers (100, 200) that a color, a pattern and an image or picture (character's image or picture, etc.) differ. That is, it is possible to easily enjoy design change of the portable game apparatus 10. In such a case, it is possible to manufacture and sell the upper cover 100 and the lower cover 200 for exchange as a single article or as a cover group that includes them.

According to this embodiment, since the cover attaching concavities 50, 60 for attaching with the covers 100, 200 are provided on the upper housing 12 and the lower housing 14 of the portable game apparatus 10, respectively, and the hook recesses 58, 70 for inserting with the hooks 116, 212 that are provided on the covers are provided, and the fitting recesses 90, 92 for fitting with the projections 118, 220 provided on the covers are provided, the covers can be constituted as a part of the housings of a portable game apparatus by attaching the covers to the cover attaching concavities.

In addition, although the cover (100, 200) is constituted as a part of the housing (12, 14) of the portable game apparatus 10 in the above-mentioned embodiment, it does not need to be limited to this. For example, it is applicable to other portable terminals like a cellular phone and a tablet PC. Furthermore, the cover may be a cover that constitutes a part of a housing of a toy that does not have an electronic device imitated the portable game apparatus 10 or a toy that does not function as a game machine.

Furthermore, although the protecting projections 218 are formed at positions on both sides sandwiching the screw hole 216 in the above-mentioned embodiment, if near the screw hole 216, the protecting projection 218 may not sandwich the screw hole 216, and the number of the projections is not limited to two in the embodiment but may be one or three or more.

Furthermore, although the upper cover attaching concavity 50 and the lower cover attaching concavity 60 are formed as concavities of the depth equivalent to the thickness of the flat portion 102 of the upper cover 100 and the thickness of the flat portion 202 of the lower cover 200, respectively in the above-mentioned embodiment, if the upper cover 100 and the lower cover 200 need not to form flat surfaces following the area 54 of the upper housing 12 and the areas 62, 64 of the lower housing 14, that is, if it is not necessary to make the surfaces flush, the upper cover attaching concavity 50 and the lower cover attaching concavity 60 may be formed as only an upper cover attaching portion and a lower cover attaching portion.

Furthermore, although bottom surfaces of the upper cover attaching concavity 50 and the lower cover attaching concavity 60 form the flat surface 50a and the flat surface 60a in this embodiment, unevenness may be formed. In such a case, unevenness corresponding to the unevenness of the bottom surfaces of the upper cover attaching concavity 50 and the lower cover attaching concavity 60 that suits the inner surface of the upper cover 100 and the lower cover 200 at unevenness may be provided.

Although certain example devices and apparatuses have been described herein, it is to be understood that the appended claims are not to be limited to the devices and apparatuses disclosed, but on the contrary, are intended to cover various modifications and equivalent arrangements included within the spirit and scope of the appended claims.

What is claimed is:

1. A cover that is attached to an attaching portion that includes a first surface and second surfaces adjacent to the first surface, comprising:
    a first cover portion that covers the first surface;
    two second cover portions that are at both ends of the first cover portion in a first direction, respectively, and cover the second surfaces;
    a first fitting projection on an inner surface of the second cover portions that fits into a fitting recess on the second surfaces; and
    a hook on and extending beyond one end edge of the first cover portion in a second direction orthogonally intersecting the first direction, the hook being inserted into a hook recess on the first surface.

2. A cover according to claim 1, further comprising a first notch in the second cover portions and configured to release the first fitting projection from the fitting recess.

3. A cover according to claim 2, wherein the first notch is at a side of an end edge opposite to the one end edge.

4. A cover according to claim 1, further comprising a second fitting projection on an end of the second cover portions opposite to an end that is coupled to the first cover portion, the second fitting projection fitting into a depression on the second surface.

5. A cover according to claim 1, wherein a fitting direction of the first fitting projection is the first direction, and an inserting direction of the hook is the second direction.

6. A cover according to claim 4, wherein a fitting direction of the first fitting projection is the first direction, and a fitting direction of the second fitting projection is a direction perpendicular to the first direction and the second direction.

7. A cover according to claim 4, wherein a fitting direction of the second fitting projection is a direction perpendicular to the first direction and the second direction, and an inserting direction of the hook is the second direction.

8. A cover according to claim 1, further comprising a screw hole in the first cover portion, and
    a protecting projection near the screw hole on an inner surface of the first cover portion.

9. A cover according to claim 1, wherein the attaching portion is on the first surface, the first surface has at least a battery accommodating portion that accommodates a battery, and the first cover portion of the cover covers the battery in the battery accommodating portion.

10. A cover according to claim 1, wherein the second cover portions further comprises a second notch to avoid a slide switch on the second surface.

11. An information processing apparatus, comprising:
a housing having a cover attaching portion that includes a first surface and second surfaces adjacent to the first surface, the second surfaces including a fitting recess, and a hook recess on the cover attaching portion; and
a cover that has a first cover portion that covers the first surface, second cover portions at of ends of the first cover portion in a first direction, respectively, to cover the seconds surfaces, a fitting projection on an inner surface of the second cover portions that fits into the fitting recess, and a hook on and extending beyond one end edge of the first cover portion in a second direction orthogonally intersecting the first direction, the hook being inserted into the hook recess.

12. An information processing apparatus with cover according to claim 11, wherein the housing comprises an upper housing and a lower housing that are coupled with each other in a foldable manner, and
the cover includes an upper cover that is attached to a first cover attaching portion of the upper housing and a lower cover that is attached to a second cover attaching portion of the lower housing.

13. An information processing apparatus with cover according to claim 12, wherein one of the first cover attaching portion and the second cover attaching portion includes at least a battery accommodating portion that accommodates a battery, and one of the upper cover and the lower cover covers the battery in the battery accommodating portion.

14. A cover group comprising a first cover and a second cover for covering a first housing and a second housing of an information processing apparatus that are coupled to each other in a foldable manner, the first housing having a first surface and a second surface adjacent to the first surface, the second housing having a third surface and a fourth surface adjacent to the third surface, wherein
the first cover has a first cover portion that covers the first surface and a second cover portion that covers the second surface, the second cover portion including a first fitting projection on an inner surface of the second cover portion and that fits into a fitting recess on the second surface, and
the second cover has a third cover portion that covers the third surface and a fourth cover portion that covers the fourth surface, the third cover portion including a screw hole, the fourth cover portion including a second fitting projection on an inner surface of the fourth cover portion and that fits into a fitting recess on the fourth surface.

15. An information processing apparatus with cover, comprising:
an information processing apparatus that has a housing, the housing having a cover attaching portion that includes a first surface and a second surface adjacent to the first surface, the second surface including a fitting recess, and a hook recess on the cover attaching portion; and
a cover that has a first cover portion that covers the first surface, a second cover portion at both ends of the first cover portion in a first direction, respectively, to cover the second surface, a fitting projection on an inner surface of the second cover portion and that fits into the fitting recess, and a hook on one end edge of the first cover portion in a second direction orthogonally intersecting the first direction and that is inserted into the hook recess, wherein
the housing includes an upper housing and a lower housing that are coupled with each other in a foldable manner, and
the cover includes an upper cover that is attached to a first cover attaching portion of the upper housing and a lower cover that is attached to a second cover attaching portion of the lower housing.

16. An information processing apparatus with cover according to claim 15, wherein one of the first cover attaching portion and the second cover attaching portion includes at least a battery accommodating portion that accommodates a battery, and one of the upper cover and the lower cover covers the battery that is accommodated in the battery accommodating portion.

* * * * *